United States Patent
Huang et al.

(10) Patent No.: US 9,960,939 B1
(45) Date of Patent: May 1, 2018

(54) TRANSMITTER AND METHOD FOR TRANSMITTING A BLUETOOTH PACKET

(71) Applicant: Beken Corporation, Shanghai (CN)

(72) Inventors: Yiming Huang, Shanghai (CN); Weifeng Wang, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 0 days. days.

(21) Appl. No.: 15/590,833

(22) Filed: May 9, 2017

(30) Foreign Application Priority Data

Apr. 19, 2017 (CN) .......................... 2017 1 0257560

(51) Int. Cl.
| | |
|---|---|
| *H04L 7/033* | (2006.01) |
| *H04L 27/12* | (2006.01) |
| *H04L 27/20* | (2006.01) |
| *H04B 1/04* | (2006.01) |

(52) U.S. Cl.
CPC ............ *H04L 27/12* (2013.01); *H04L 7/0331* (2013.01); *H04L 27/2017* (2013.01); *H04B 2001/0408* (2013.01)

(58) Field of Classification Search
CPC ... H04L 27/12; H04L 27/2017; H04L 7/0331; H04B 2001/0408
USPC .................................. 375/295, 146, 302, 135
See application file for complete search history.

(56) References Cited

U.S. PATENT DOCUMENTS

| | | | |
|---|---|---|---|
| 8,170,494 B2* | 5/2012 | Husted ..................... | H03C 5/00 455/73 |
| 8,929,484 B2* | 1/2015 | McCune, Jr. ......... | H04L 27/362 330/10 |
| 2009/0311979 A1* | 12/2009 | Husted ..................... | H03C 5/00 455/102 |

OTHER PUBLICATIONS

Bluetooth Specification, Version 4.0, vol. 2, pp. 40-42, http://limcorp.net/2009/bluetooth-core-specification-v4.

* cited by examiner

*Primary Examiner* — Siu Lee
(74) *Attorney, Agent, or Firm* — Perkins Coie LLP

(57) ABSTRACT

Embodiments discloses a transmitter for transmitting a Bluetooth packet in an enhanced data rate format. The Bluetooth packet includes a GFSK modulated segment, a Guard segment and a DPSK modulated segment. The transmitter comprises a first multiplexer configured to select a phase signal from a Guard phase signal, a received GFSK phase signal and a received DPSK phase signal based on time; a second multiplexer configured to select a amplitude signal from a Guard amplitude signal, a received GFSK amplitude signal and a received DPSK amplitude signal based on time, a phase to frequency converter communicatively coupled to the first multiplexer and configured to convert the selected phase signal into converted frequency signal. The transmitter further comprises a phase lock loop, a digital to analog converter and a power amplifier.

14 Claims, 8 Drawing Sheets

TRANSMITTER AND METHOD FOR TRANSMITTING A BLUETOOTH PACKET

CROSS REFERENCE OF RELATED APPLICATIONS

This application claims priority to Chinese Application number 201710257560.9 entitled "transmitter and method for transmitting a Bluetooth packet," filed on Apr. 19, 2017 by Beken Corporation, which is incorporated herein by reference.

TECHNICAL FIELD

The present application relates to Bluetooth technology and more particularly, but not exclusively, to a transmitter and a method for transmitting a Bluetooth packet.

BACKGROUND

Bluetooth enhanced data rate (EDR) packet includes a Gaussian frequency-shift keying (GFSK) modulated segment and a Differential Phase-Shift Keying (DPSK) modulated segment. During modulation, both an amplitude AMP and a phase PHA are switched directly from the GFSK modulation scheme to the DPSK modulation scheme. Since GFSK and DPSK are different modulation schemes, the amplitude of the GFSK end point differs greatly from the amplitude of the DPSK starting point, and the phases of the GFSK end point and the DPSK starting point are also largely different. The above direct switching results in amplitude and phase discontinuities, which leads to a spectral leakage at the baseband. The leakage passes through a phase-locked loop (PLL) and a Power Amplifier (PA), and is finally transmitted at the Radio Frequency (RF), which leads to a deterioration of the Adjacent Channel Power Ratio (ACPR). ACPR is defined as the ratio between the total power adjacent channel (intermodulation signal) to the main channel's power (useful signal). ACPR is desired to be as low as possible. A high ACPR indicates that significant spectral spreading has occurred.

SUMMARY

An embodiment of the invention discloses a transmitter for transmitting a Bluetooth packet in an enhanced data rate format, the Bluetooth packet includes a Gaussian frequency-shift keying (GFSK) modulated segment, a Guard segment and a Differential Phase-Shift Keying (DPSK) modulated segment, the transmitter comprising: a first multiplexer configured to select a phase signal from a Guard phase signal, a received GFSK phase signal and a received DPSK phase signal based on time; a second multiplexer configured to select a amplitude signal from a Guard amplitude signal, a received GFSK amplitude signal and a received DPSK amplitude signal based on time, a phase to frequency converter communicatively coupled to the first multiplexer and configured to convert the selected phase signal into converted frequency signal; a phase lock loop communicatively coupled to the phase to frequency converter and configured to generate a local oscillation signal based the converted frequency signal; a digital to analog converter communicatively coupled to the second multiplexer and configured to convert the selected amplitude into an analog selected amplitude; and a power amplifier communicatively coupled to both the phase lock loop and the digital to analog converter and configured to generate and output a radio frequency signal based on the local oscillation signal and the analog selected amplitude.

An embodiment of the invention discloses a method of transmitting a Bluetooth packet in an enhanced data rate format, the Bluetooth packet includes a Gaussian frequency-shift keying (GFSK) modulated segment, a Guard segment and a Differential Phase-Shift Keying (DPSK) modulated segment, the method comprising: selecting, by a first multiplexer, a phase signal from a Guard phase signal, a received GFSK phase signal and a received DPSK phase signal based on time; selecting, by a second multiplexer, a amplitude signal from a Guard amplitude signal, a received GFSK amplitude signal and a received DPSK amplitude signal based on time, converting, by a phase to frequency converter communicatively coupled to the first multiplexer, the selected phase signal into converted frequency signal; generating, by a phase lock loop communicatively coupled to the phase to frequency converter, a local oscillation signal based the converted frequency signal; converting, by a digital to analog converter communicatively coupled to the second multiplexer, the selected amplitude into an analog selected amplitude; and generating and outputting, by a power amplifier communicatively coupled to both the phase lock loop and the digital to analog converter, a radio frequency signal based on the local oscillation signal and the analog selected amplitude.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling descriptive examples. Those skilled in the art will understand, however, that the invention may be practiced without many of these details. Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1A:
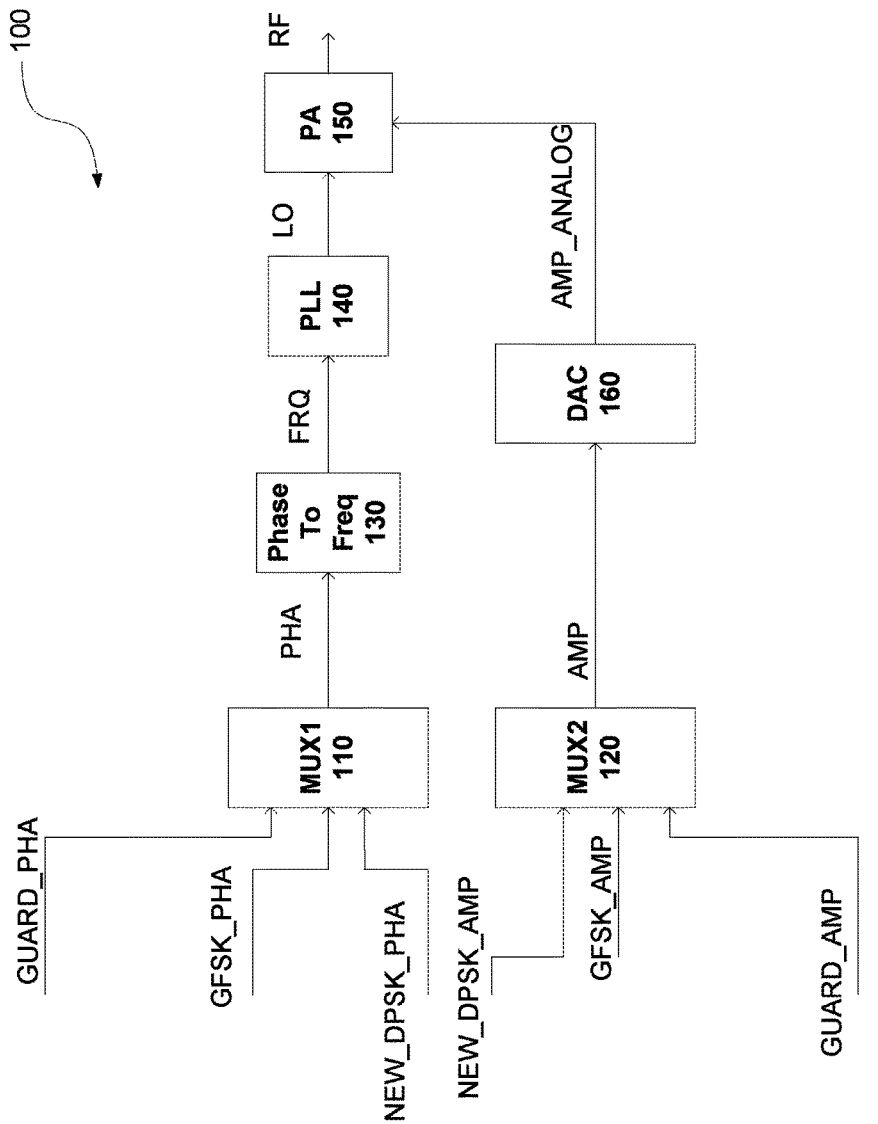
FIG. 1A is a circuit diagram illustrating a transmitter for transmitting Bluetooth EDR packets according to an embodiment of the present invention.

FIG. 1A is a circuit diagram illustrating a transmitter 100 for transmitting Bluetooth EDR packets according to an embodiment of the present invention. The transmitter 100 is used for transmitting a Bluetooth packet in an enhanced data rate format. The Bluetooth packet includes a Gaussian frequency-shift keying (GFSK) modulated segment, a Guard segment and a Differential Phase-Shift Keying (DPSK) modulated segment. The transmitter 100 comprises a first multiplexer 110, a second multiplexer 120, a phase to frequency converter 130, a phase lock loop 140, a power amplifier 150, and a digital to analog converter 160.

The first multiplexer 110 is configured to select a phase signal PHA from a Guard phase signal GUARD_PHA, a received GFSK phase signal GFSK_PHA and a received DPSK phase signal NEW_DPSK_PHA based on time. For example, before a first predetermined time t1, the first multiplexer 110 selects the received GFSK phase signal GFSK_PHA as the phase signal PHA, during the period after the first predetermined time t1 and before a second predetermined time t2, the first multiplexer 110 selects the Guard phase signal GUARD_PHA as the phase signal PHA, and after the second predetermined time t2, the first multiplexer 110 selects the received DPSK phase signal NEW_DPSK_PHA as the phase signal PHA.

As a result, the phase signal PHA is the output of the first multiplexer 110. In an embodiment, the phase signal PHA output from the first multiplexer 110 conforms to the Bluetooth EDR format. The first four fields of the phase signal PHA equals the received GFSK phase signal GFSK_PHA, the guard field of the phase signal PHA equals the Guard phase signal GUARD_PHA, and the last three fields of the phase signal PHA equals the received DPSK phase signal NEW_DPSK_PHA.

The second multiplexer 120 is configured to select a amplitude signal AMP from a Guard amplitude signal GUARD_AMP, a received GFSK amplitude signal GFSK_AMP and a received DPSK amplitude signal NEW_DPSK_AMP based on time. Similarly to the first multiplexer 110, before the first predetermined time t1, the second multiplexer 120 selects the received GFSK amplitude signal GFSK_AMP as the amplitude signal AMP, during the period after the first predetermined time t1 and before the second predetermined time t2, the second multiplexer 120 selects the Guard amplitude signal GUARD_AMP as the amplitude signal AMP, and after the second predetermined time t2, the second multiplexer 120 selects the received DPSK amplitude signal NEW_DPSK_AMP as the amplitude signal AMP.

As a result, the amplitude signal AMP is the output of the second multiplexer 120. In an embodiment, the amplitude signal AMP output from the second multiplexer 120 also conforms to the Bluetooth EDR format. The first four fields of the amplitude signal AMP equals the received GFSK amplitude signal GFSK_AMP, the guard field of the amplitude signal AMP equals the Guard amplitude signal GUAR-D_AMP, and the last three fields of the amplitude signal AMP equals the received DPSK amplitude signal NEW_DPSK_AMP.

The phase to frequency converter 130 is communicatively coupled to the first multiplexer 110 and configured to convert the selected phase signal PHA into converted frequency signal FRQ.

The phase lock loop 140 is communicatively coupled to the phase to frequency converter 130 and configured to generate a local oscillation (LO) signal LO based the converted frequency signal FRQ.

The digital to analog converter 160 is communicatively coupled to the second multiplexer 120 and configured to convert the selected amplitude AMP into an analog selected amplitude AMP_ANALOG.

The power amplifier 150 is communicatively coupled to both the phase lock loop 140 and the digital to analog converter 160 and configured to generate and output a radio frequency signal RF based on the local oscillation signal LO and the analog selected amplitude AMP_ANALOG For example, the power amplifier 150 obtains the radio frequency signal RF by multiplying the analog selected amplitude AMP_ANALOG with the local oscillation signal LO. The output of the power amplifier 150 is connected to radio frequency devices (not shown in FIG. 1A).

Figure 1B:
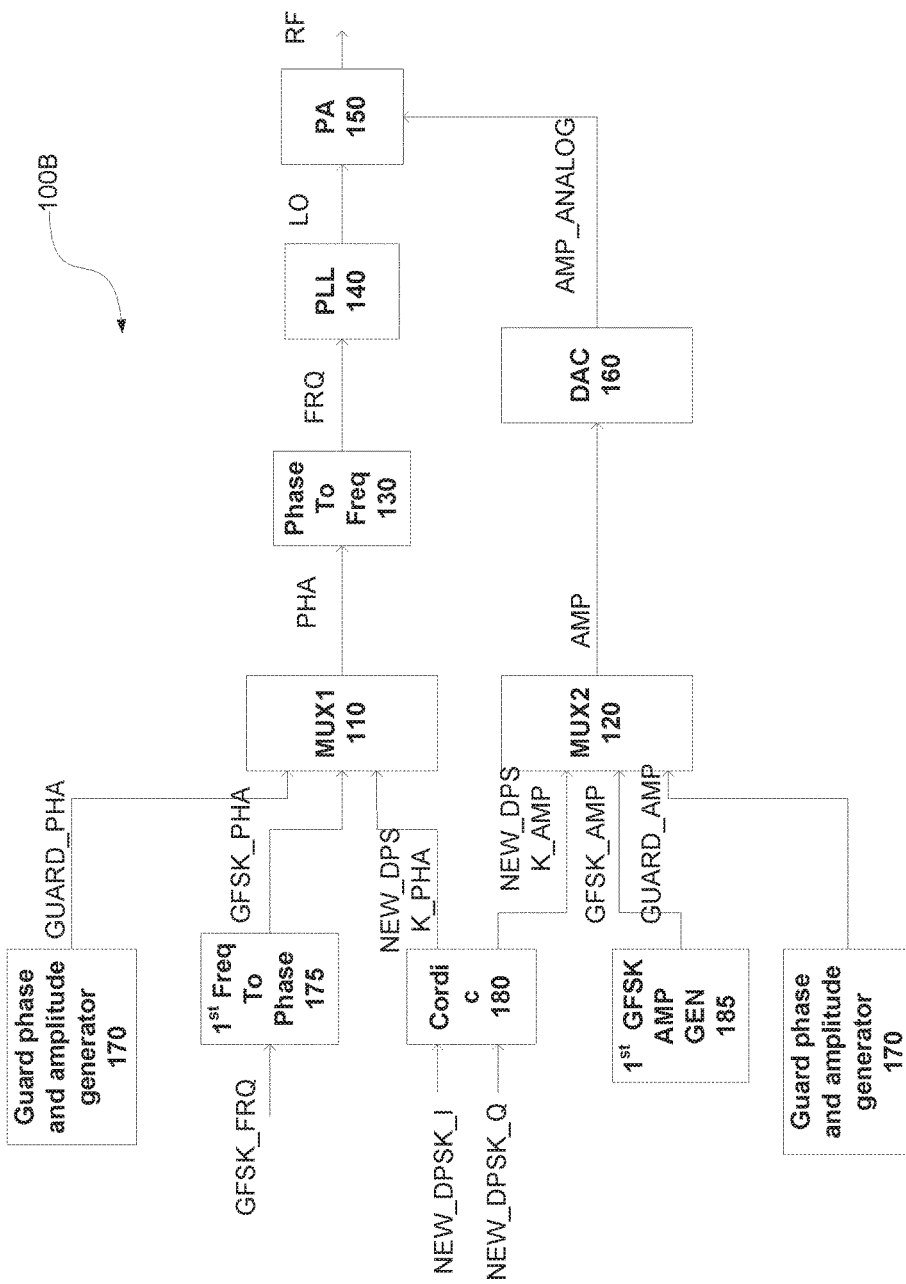
FIG. 1B is a circuit diagram illustrating a transmitter for transmitting Bluetooth EDR packets according to another embodiment of the present invention.

FIG. 1B is a circuit diagram illustrating a transmitter 100B for transmitting Bluetooth EDR packets according to another embodiment of the present invention. In addition to the first multiplexer 110, the second multiplexer 120, the phase to frequency converter 130, the phase lock loop 140, the power amplifier 150, and the digital to analog converter 160 already discussed with respect to FIG. 1A, the transmitter 100B further comprises a first frequency to phase converter 175, a Coordinate Rotation Digital Computer (cordic) 180, a first GFSK amplitude generator 185, a Guard phase and amplitude generator 170.

The first frequency to phase converter 175 is communicatively coupled to the first multiplexer 110 and configured to convert a frequency of the GFSK modulated segment GFSK_FRQ into the GFSK phase signal GFSK_PHA. As shown in FIG. 1B, the input of the first frequency to phase converter 175, that is, the frequency of the GFSK modulated segment GFSK_FRQ, is the frequency of the first four fields of a EDR packet, including the preamble, the syncword, the trailer and the header. For example, both the frequency of GFSK modulated segment GFSK_FRQ and the GFSK phase signal GFSK_PHA are 8-bit-width digital signals with a sampling rate of 13 MHz. Unless otherwise stated, all frequencies, phases, and amplitudes mentioned below are 8-bit-width digital signals with a sampling rate of 13 MHz.

Figure 2:
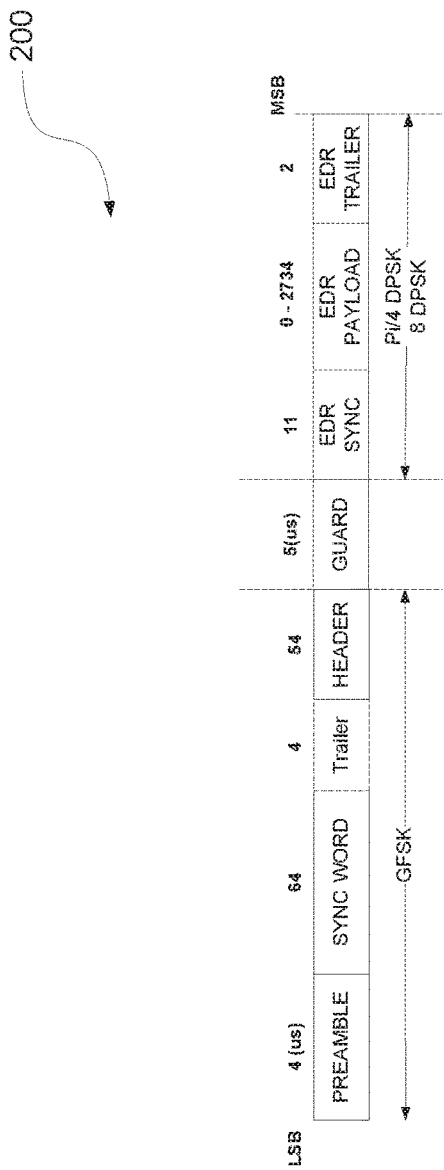
FIG. 2 is a diagram illustrating a frame structure of Bluetooth enhanced data rate (EDR) packet according to an embodiment of the present invention.

The Coordinate Rotation Digital Computer (cordic) 180 is communicatively coupled to both the first multiplexer 110 and the second multiplexer 120 and configured to generate the received DPSK phase signal NEW_DPSK_PHA and the received DPSK amplitude signal NEW_DPSK_AMP based on an in-phase branch NEW_DPSK_I and a quadrature branch NEW_DPSK_Q of the DPSK modulated segment. The in-phase branch NEW_DPSK_I and a quadrature branch NEW_DPSK_Q of the DPSK modulated segment are respectively generated by baseband IQ signal generator. Note the method for generating I branch signal and Q branch signal and the baseband IQ signal generator can be found at least in publicly available Bluetooth Specifications. The received DPSK amplitude signal NEW_DPSK_AMP and the received DPSK phase signal NEW_DPSK_PHA will be discussed in further detail with respect to FIG. 2. As shown in FIG. 2, the NEW_DPSK_I and the NEW_DPSK_Q are in-phase and quadrature branches of the last three fields, that is the DPSK modulated segment, including the DPSK modulated EDR Sync field, EDR payload field and EDR trailer field.

The first GFSK amplitude generator 185 is communicatively coupled to the second multiplexer 120 and configured to generate the GFSK amplitude signal GFSK_AMP based on the GFSK modulated segment which corresponds to the first 4 fields in FIG. 2. The amplitude of the GFSK amplitude signal GFSK_AMP is selected from the set including 127, 100,80 and 64. Wherein 127 represents the maximum value among the four values, and the remaining values decreased by 2 dB. For example, 20*log 10(100/127)=−2 dB. Note the values of the amplitude can be preset to different values. Further, the output sampling rate is 13 MHz.

The Guard phase and amplitude generator 170 is configured to generate the Guard phase signal GUARD_PHA and the Guard amplitude signal GUARD_AMP based on the Guard segment.

FIG. 2 is a diagram illustrating a frame structure 200 of Bluetooth enhanced data rate (EDR) packet according to an embodiment of the present invention.

As shown in FIG. 2, the unit of marked numbers above each field of the frame structure 200 is in microseconds (us or μs). Each field is described from the least significant bit (LSB) to the most significant bit (MSB) as follows:

PREAMBLE: 4 bits, and preamble may take the value of 1010 (when SYNC WORD LSB=1) or 0101 (when SYNC WORD LSB=0)

SYNC WORD is used for synchronization, which has 64 bits and is configured by software. The MSB 6 bits of the Sync word may take the value of 001101 or 110010. The last two MSBs are SYNC WORD [62:63], in which bit 63 is the most significant bit.

Trailer: may have the value of 0101 (if SYNC WORD [63]=1) or 1010 (if SYNC WORD [63]=0)

HEADER: The header field contains the consequent payload type, packet length information.

GUARD: The GUARD field may have a length of 5 μs, which is used for the system including RF and digital part to switch from BR (basic rate) mode to EDR mode.

EDR SYNC: EDR SYNC includes 11 EDR sync words, and the EDR sync word is {Sref S [1:10]}, which is configured by software; usually where Sref is arbitrary symbol, and S [1:10]=[1 3 1 3 1 3 3 1 1 1] (for pi/4 DPSK (which can also be represented as π/4 DPSK) or S [1:10]=[2 7 2 7 2 7 7 2 2 2] (for 8 DPSK).

EDR PAYLOAD: EDR PAYLOAD is modulated using DPSK, and the length is configured by software.

EDR TRAILER: For Enhanced Data Rate packets, two trailer symbols shall be added to the end of the payload. The trailer bits shall be all zero, i.e. {00, 00} for the π/4-DQPSK and {000, 000} for the 8 DPSK.

As shown in FIG. 2, the first four fields are modulated by Gaussian Frequency Shift Keying (GFSK). There is no specified modulation scheme for GUARD field. The modulation scheme for the last three fields are selected according to the transmission rate. For example, if the transmission rate is 2 Mbps, then pi/4 DPSK is selected as the modulation scheme, which is determined by the payload type in the header. If the transmission rate is 3 Mbps, then 8 DPSK is selected as the modulation scheme.

Figure 3:
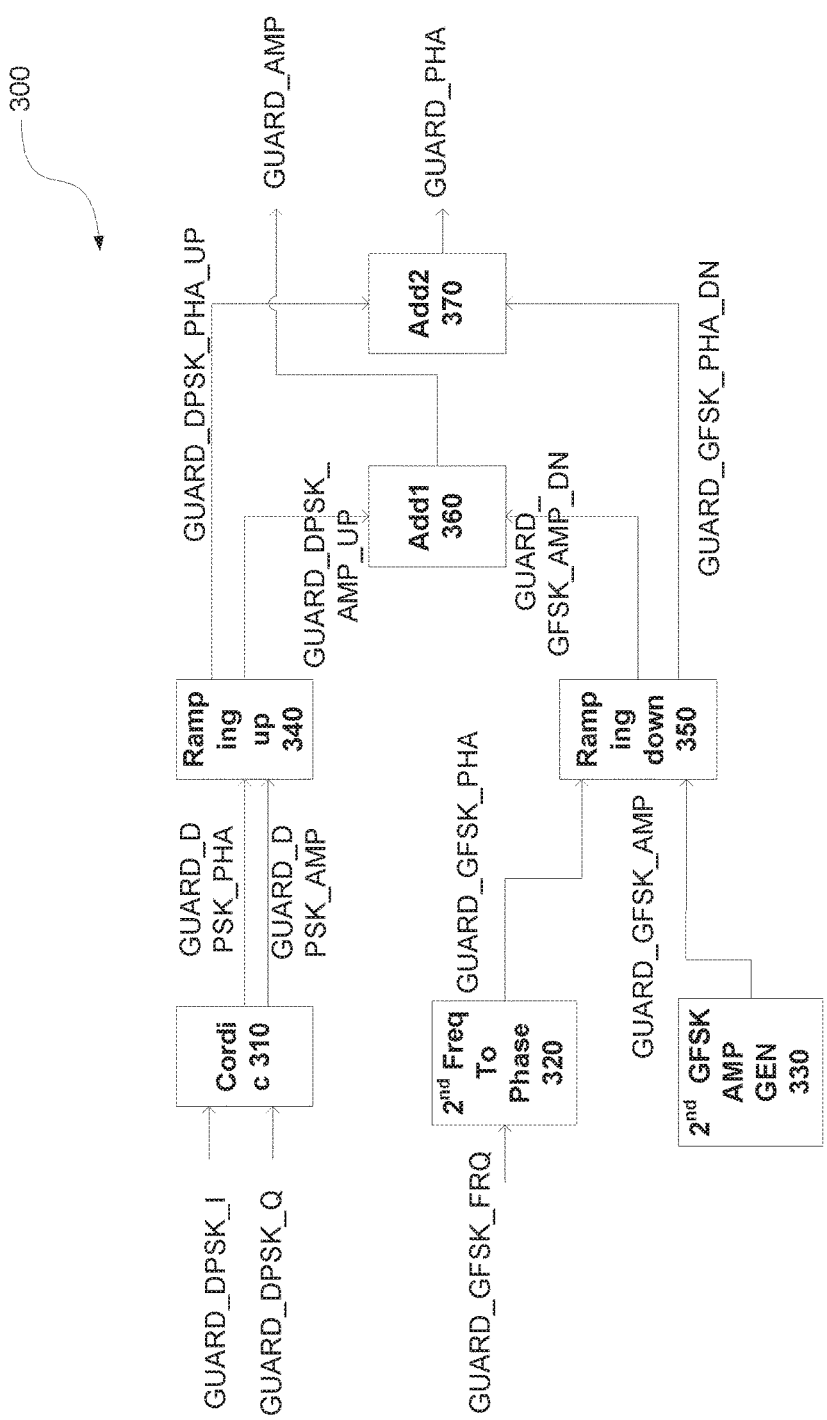
FIG. 3 is a circuit diagram illustrating a Guard phase and amplitude generator according to an embodiment of the invention.

FIG. 3 is a circuit diagram illustrating a Guard phase and amplitude generator 300 according to an embodiment of the invention. As shown in FIG. 3, the Guard phase and amplitude generator 300 further comprises a cordic module 310, a second frequency to phase converter 320, a GFSK amplitude generator 330, a ramping up unit 340, a ramping down unit 350, a first adder 360 and a second adder 370. The cordic module 310 is configured to generate a Guard DPSK phase signal GUARD_DPSK_PHA and a Guard DPSK amplitude signal GUARD_GFSK_PHA based on an in-phase branch GUARD_DPSK_I and a quadrature branch GUARD_DPSK_Q of a DPSK modulated Guard signal. In an embodiment, the cordic module 310 in FIG. 3 and the Cordic 180 in FIG. 1B can be substantially similar.

The second frequency to phase converter 320 is configured to convert a frequency of a GFSK modulated Guard signal GUARD_GFSK_FRQ into a phase signal GUARD_GFSK_PHA of the GFSK modulated Guard signal. In an embodiment, the first frequency to phase converter 175 in FIG. 1B and the second frequency to phase converter 320 can be substantially similar.

The second GFSK amplitude generator 330 is configured to generate the GUARD GFSK amplitude signal (or can also be called as GFSK modulated Guard amplitude signal) GUARD_GFSK_AMP, for example, based on the GFSK modulated segment which corresponds to the first 4 fields in FIG. 2. In an embodiment, the first GFSK amplitude generator 185 in FIG. 1B and the second GFSK amplitude generator 330 can use be substantially similar.

The ramping up unit 340 is communicatively coupled to the cordic module 310 and configured to generate a ramped up Guard DPSK phase signal GUARD_DPSK_PHA_UP and a ramped up Guard DPSK amplitude signal GUARD_DPSK_AMP_UP based on both the Guard DPSK phase signal GUARD_DPSK_PHA and the Guard DPSK amplitude signal GUARD_DPSK_AMP outputted by the Cordic 310. In other words, the phase of the ramped up Guard DPSK phase signal GUARD_DPSK_PHA_UP is gradually increased, and the amplitude of the Guard DPSK amplitude signal GUARD_DPSK_AMP_UP is also gradually increased.

The ramping down unit 350 is communicatively coupled to the second frequency to phase converter 320 and the second GFSK amplitude generator 330 and configured to generate a ramped down Guard GFSK phase signal GUARD_GFSK_PHA_DN and a ramped down Guard GFSK amplitude signal GUARD_GFSK_AMP_DN based on the Guard GFSK phase signal GUARD_GFSK_PHA and the Guard GFSK amplitude signal GUARD_GFSK_PHA.

In other words, the phase of the ramped down Guard GFSK phase signal GUARD_GFSK_PHA_DN is gradually decreased, and the amplitude of the Guard GFSK amplitude signal GUARD_GFSK_AMP_DN is also gradually decreased.

The first adder 360 is communicatively coupled to both the ramping up unit 340 and the ramping down unit 350 and configured to generate and output a Guard amplitude signal GUARD_AMP by adding the ramped up Guard DPSK amplitude signal and the ramped down Guard GFSK amplitude signal. The Guard amplitude signal GUARD_AMP is in turn fed into the second multiplexer 120 as shown in FIG. 1A.

The second adder 370 is communicatively coupled to both the ramping up unit 340 and the ramping down unit 350 and configured to generate and output a Guard phase signal GUARD_PHA by adding the ramped up Guard DPSK phase signal GUARD_DPSK_PHA_UP and the ramped down Guard GFSK phase signal GUARD_GFSK_AMP_DN. The Guard phase signal GUARD_PHA is in turn fed into the first multiplexer 110 as shown in FIG. 1A.

Figure 4A:
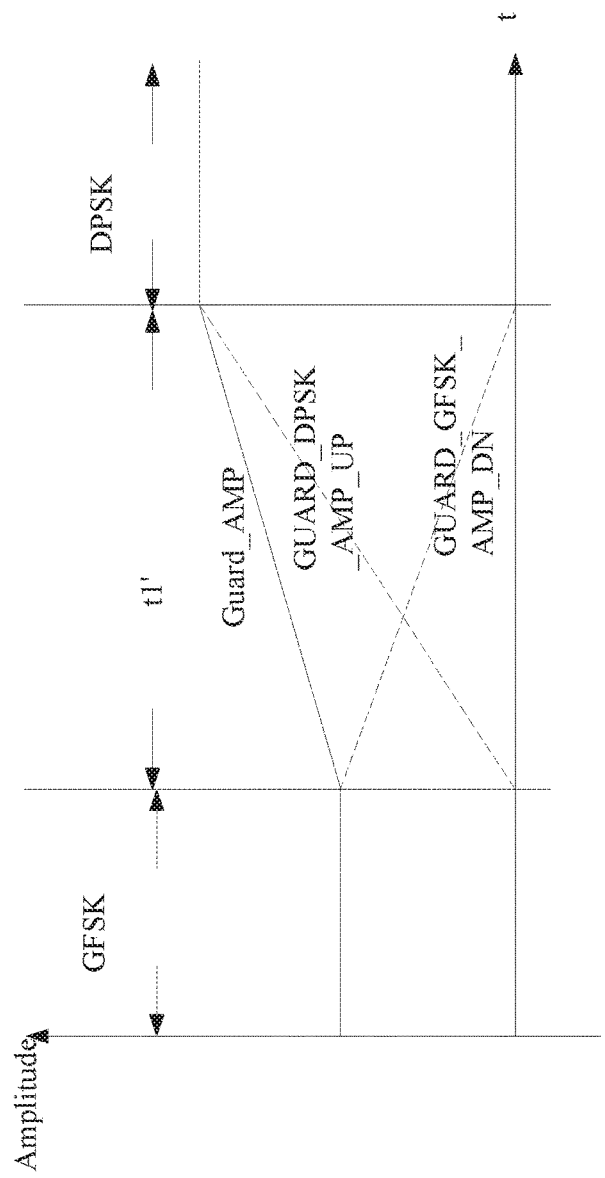
FIG. 4A and FIG. 4B are diagrams respectively illustrating the amplitude and the frequency of the adjusted guard signal according to an embodiment of the invention.
Figure 4B:
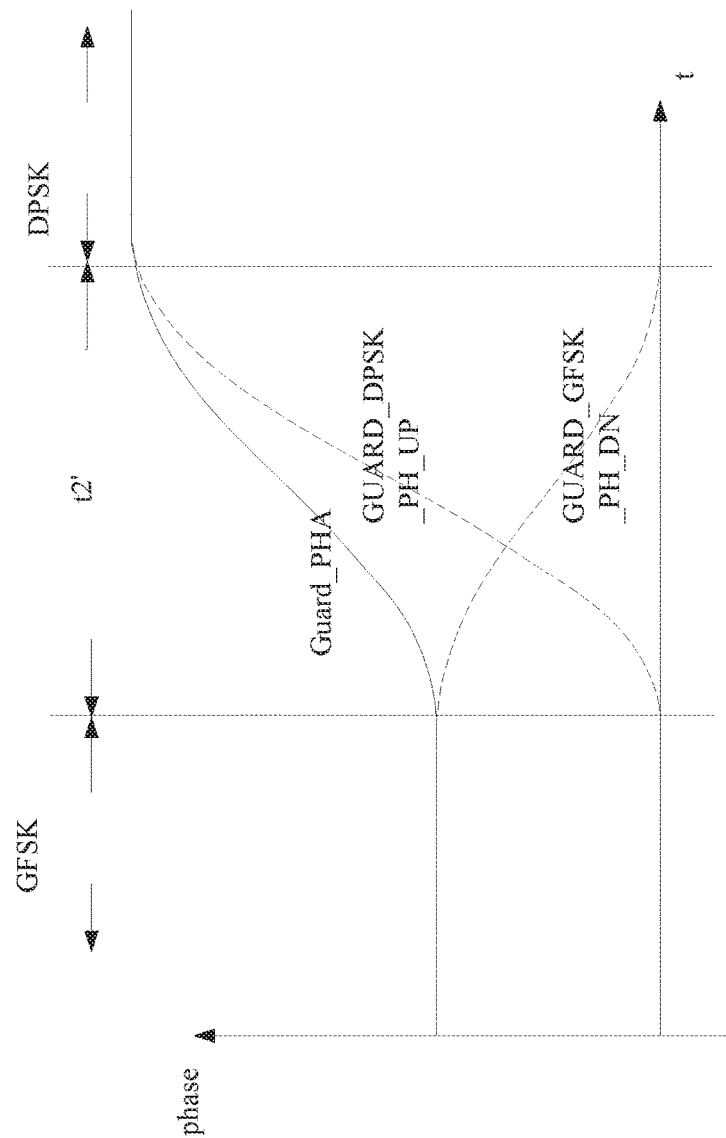

FIG. 4A and FIG. 4B are diagrams respectively illustrating the amplitude and the phase of the adjusted guard signal according to an embodiment of the invention. The ramping up unit 340 and the ramping down unit 350 are configured to use any of the window functions to perform the ramping down/up operation, for example, Hamming window, Blackman window, Triangular window or Gaussian window. For example, both ramping up unit 340 and the ramping down unit 350 are configured to use Hamming windows to generate phase signal GUARD_DPSK_PHA_UP and GUARD_GFSK_PHA_DN as illustrated in FIG. 4B, and configured to use Triangular window to generate amplitude signal GUARD_DPSK_AMP_UP and GUARD_GFSK_AMP_DN as illustrated in FIG. 4A. Note the ascending dotted line in FIG. 4B represents phase signal GUARD_DPSK_PHA_UP, and the descending dotted line in FIG. 4B represents phase signal GUARD_GFSK_PHA_DN. Further, the solid line in FIG. 4B represents the desired signal Guard_PHA, which is the sum of GUARD_DPSK_PHA_UP and GUARD_GFSK_PHA_DN. The ascending dotted line in FIG. 4A represents amplitude signal GUARD_DPSK_AMP_UP, and the descending dotted line in FIG. 4A represents the amplitude signal GUARD_DPSK_AMP_DN. Further, the solid line in FIG. 4A represents the desired signal Guard_AMP, which is the sum of GUARD_DPSK_AMP_UP and GUARD_DPSK_AMP_DN. The duration of t1' for the guard amplitude signal Guard_AMP should be same as the t2' for the guard phase signal Guard_PHA.

In another embodiment, as shown in FIG. 3, the ramping up unit 340 receives input signals Guard DPSK phase signal GUARD_DPSK_PHA and Guard DPSK amplitude signal GUARD_DPSK_AMP, and outputs ramped up Guard DPSK phase signal GUARD_DPSK_PHA_UP and ramped up Guard DPSK amplitude signal GUARD_DPSK_AMP_UP. The ramping up unit 340 may use the following vector UP_VEC to weigh the input signals. For example, UP_VEC=[1/65, 2/65, . . . , 65/65] supposing there are 65 sampling points, and the vector UP_VEC is corresponding to 65 sampling points.

GUARD_DPSK_AMP_UP=GUARD_DPSK_AMP.*UP_VEC; GUARD_DPSK_PHA_UP=GUARD_DPSK_PHA.*UP_VEC;

Similarly, the ramping down unit 350 receives Guard GFSK phase signal GUARD_GFSK_PHA and Guard GFSK amplitude signal GUARD_GFSK_AMP, and outputs ramped down Guard GFSK phase signal GUARD_GFSK_PHA_DN and ramped down Guard GFSK amplitude signal GUARD_GFSK_AMP_DN. The ramping down unit 350 may use the following vector DN_VEC to weigh the input signals. For example, DN_VEC=[65/65, 64/65, . . . , 1/65], GUARD_GFSK_AMP_DN=GUARD_GFSK_AMP.*DN_VEC; GUARD_GFSK_PHY_DN=GUARD_GFSK_PHY.*DN_VEC;

The first adder 360 receives GUARD_DPSK_AMP_UP and GUARD_GFSK_AMP_DN, and outputs GUARD_AMP. For example, GUARD_AMP=GUARD_DPSK_AMP ATK+GUARD_GFSK_AMP_DN Similarly, the second adder 370 receives GUARD_DPSK_PHA_UP and GUARD_GFSK_PHA_DN, and outputs GUARD_PHA. For example, GUARD_PHA=GUARD_DPSK_PHA_ATK+GUARD_GFSK_PHA_DN Both the ramping up unit 340 and the ramping down unit 350 change gradually. As a result, the amplitude of the end point of the GFSK signal is substantially the same as the amplitude of the starting point of the GUARD signal, and the amplitude of the end point of the GUARD signal is substantially the same as the amplitude of the starting point of the DPSK signal. Further, the amplitude of the GUARD signal is also continuous. As a result, the whole range of the envelope is continuous, for example, as shown in FIGS. 4A and 4B. Similarly, the phase of the end point of GFSK signal is substantially the same as the phase of the start point of the GUARD signal, and the phase of the end point of the GUARD signal is substantially the same as the phase of the start point of the DPSK signal. The phase of the GUARD signal is also continuous. Therefore, spectrum leakage does not occur in the baseband, as shown in the FIG. 6B discussed below, that is, ACPR (adjacent channel power ratio) is improved.

Figure 5:
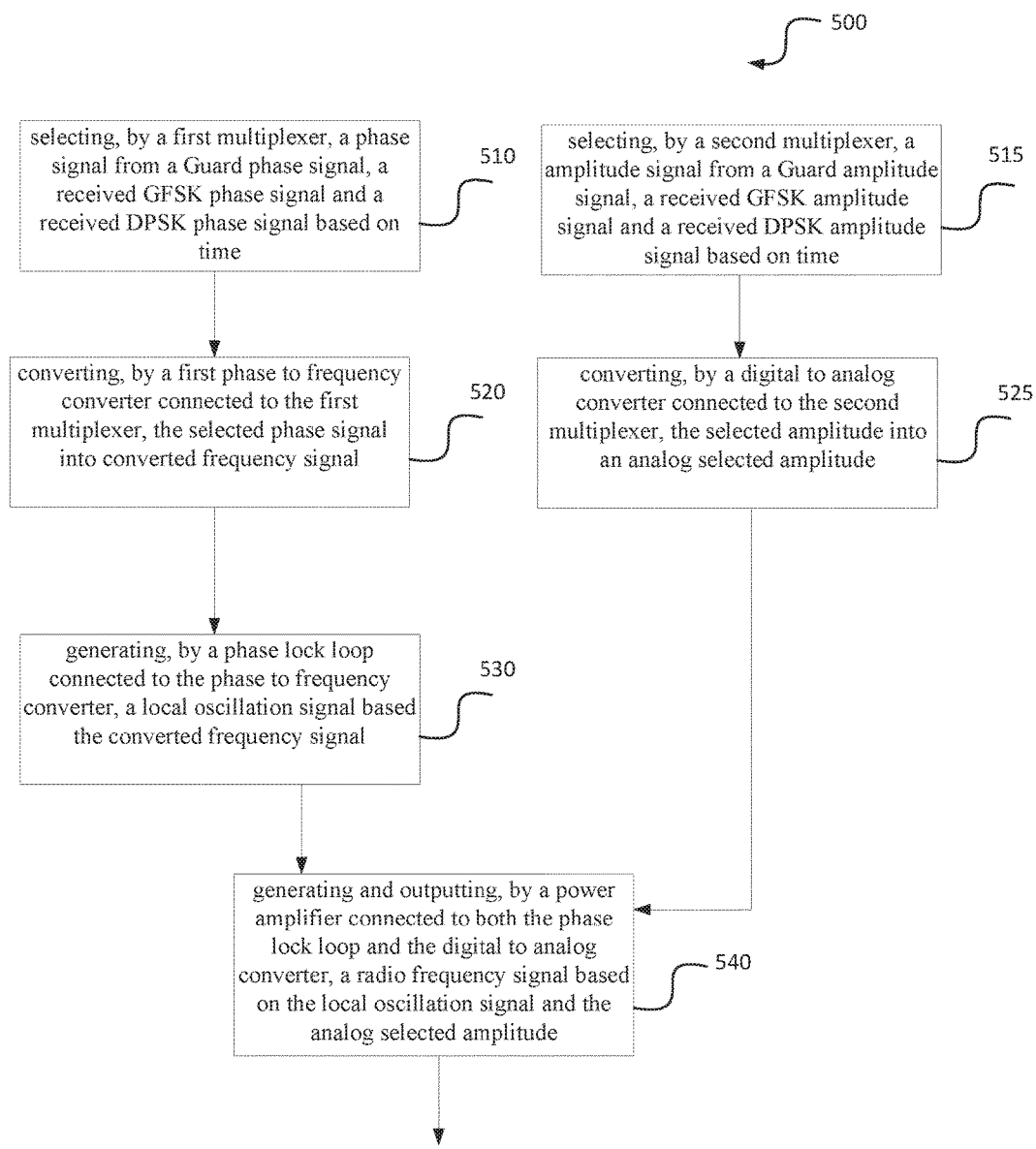
FIG. 5 is a flow chart illustrating a method of transmitting modulated Bluetooth EDR packet according to an embodiment of the invention.

FIG. 5 is a flow chart illustrating a method 500 of transmitting modulated Bluetooth EDR packet according to an embodiment of the invention. The Bluetooth packet includes a Gaussian frequency-shift keying (GFSK) modulated segment, a Guard segment and a DPSK modulated segment. The method 500 comprises selecting in block 510, by a first multiplexer, a phase signal from a Guard phase signal, a received GFSK phase signal and a received DPSK phase signal based on time, selecting in block 515, by a second multiplexer, a amplitude signal from a Guard amplitude signal, a received GFSK amplitude signal and a received DPSK amplitude signal based on time, converting in block 520, by a phase to frequency converter communicatively coupled to the first multiplexer, the selected phase signal into converted frequency signal; generating in block 530, by a phase lock loop communicatively coupled to the phase to frequency converter, a local oscillation signal based the converted frequency signal; converting in block 525, by a digital to analog converter communicatively coupled to the second multiplexer, the selected amplitude into an analog selected amplitude; and generating and outputting in block 540, by a power amplifier communicatively coupled to both the phase lock loop and the digital to analog converter, a radio frequency signal based on the local oscillation signal and the analog selected amplitude. Note as shown in FIG. 5, the signal processing path including blocks 510, 520 and 530, and the signal processing path including blocks 515 and 525 are parallel.

Alternatively, the method further comprises, converting, by a first frequency to phase converter communicatively coupled to the first multiplexer, a frequency of the GFSK modulated segment into the GFSK phase signal. (not shown in FIG. 5)

Alternatively, the method further comprises generating, by a Coordinate Rotation Digital Computer (cordic) communicatively coupled to both the first multiplexer and the second multiplexer, the received DPSK phase signal and the received DPSK amplitude signal based on an in-phase branch and a quadrature branch of the DPSK modulated segment. (not shown in FIG. 5)

Alternatively, the method further comprises generating, by a first GFSK amplitude generator communicatively coupled to the second multiplexer, the GFSK amplitude signal based on the GFSK modulated segment. (not shown in FIG. 5)

Alternatively, the method further comprises generating, by a Guard phase and amplitude generator, the Guard phase signal and the Guard amplitude signal based on the Guard segment. (not shown in FIG. 5)

Alternatively, generating, by a Guard phase and amplitude generator, the Guard phase signal and the Guard amplitude signal based on the Guard segment is further implemented by: generating, by a cordic module, a Guard DPSK phase signal and a Guard DPSK amplitude signal based on an in-phase branch and a quadrature branch of a DPSK modulated Guard signal; converting, by a second frequency to phase converter, a frequency of a GFSK modulated Guard signal into a phase signal of the GFSK modulated Guard signal; generating, by a first GFSK amplitude generator communicatively coupled to the second multiplexer, the GFSK amplitude signal; generating, by a ramping up unit communicatively coupled to the cordic module, a ramped up Guard DPSK phase signal and a ramped up Guard DPSK amplitude signal based on the Guard DPSK phase signal and the Guard DPSK amplitude signal; generating, by a ramping down unit communicatively coupled to the second frequency to phase converter, a ramped down Guard GFSK phase signal and a ramped down Guard GFSK amplitude signal based on the Guard GFSK phase signal and the Guard GFSK amplitude signal; generating and outputting, by a first adder communicatively coupled to both the ramping up unit and the ramping down unit, a Guard amplitude signal by adding the ramped up Guard DPSK amplitude signal and the ramped down Guard GFSK amplitude signal; and generating and outputting, by a second adder communicatively coupled to both the ramping up unit and the ramping down unit, a Guard phase signal by adding the ramped up Guard DPSK phase signal and the ramped down Guard GFSK phase signal.

Alternatively, the method further comprises using any of the window functions to perform the ramping down/up operation: Hamming window, Blackman window, Triangular window or Gaussian window.

Figure 6A:
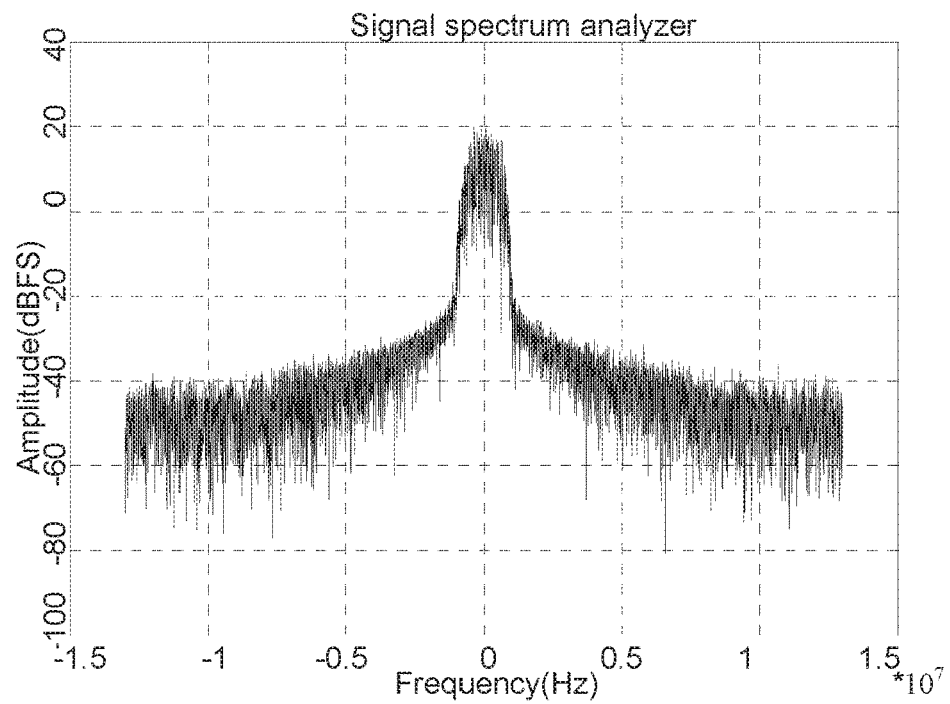
FIG. 6A is a diagram illustrating an output of a conventional signal spectrum analyzer.
Figure 6B:
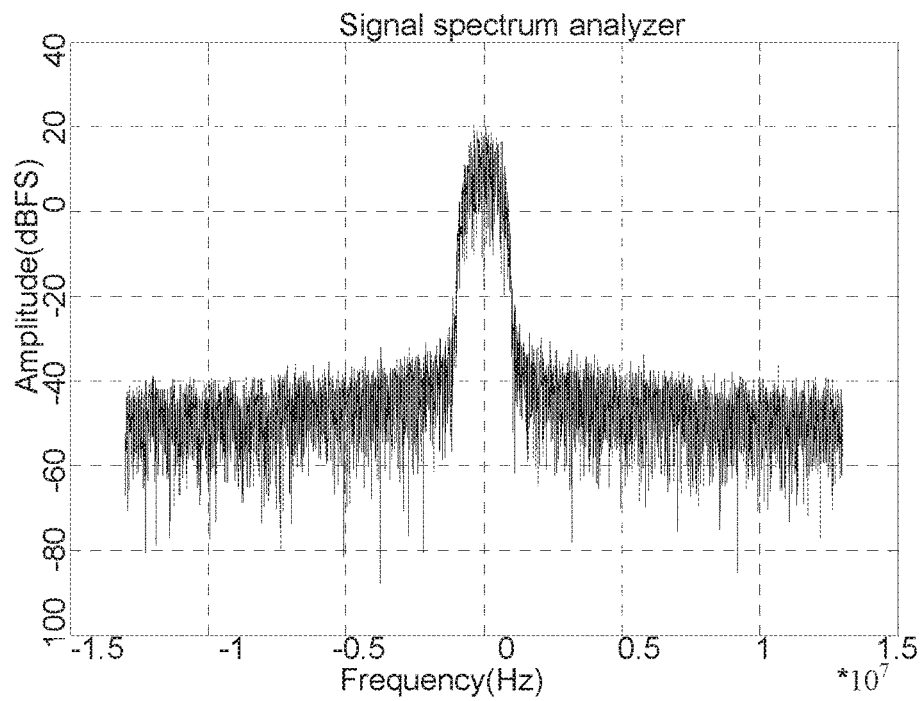
FIG. 6B is a diagram illustrating an output of signal spectrum analyzer according to an embodiment of the invention.

FIG. 6A is a diagram illustrating an output of a conventional signal spectrum analyzer, and FIG. 6B is a diagram illustrating an output of signal spectrum analyzer according to an embodiment of the invention. From FIG. 6A, it can be obtained that the Adjacent channel power ratio of 3M frequency is about −50 dB, which equals the difference between the amplitude at 3M and the amplitude at 0, that is, −30 dB −20 dB( ) From FIG. 6B, it can be obtained that the Adjacent channel power ratio of 3M frequency is about −60 dB, which equals the difference between the amplitude at 3M and the amplitude at 0, that is, −40 dB−20 dB. Comparing FIGS. 6A and 6B, it can be easily obtained that the ACPR is improved in the embodiment of the invention with respect to the conventional device, as the ACPR value decreases.

From the foregoing, it will be appreciated that specific embodiments of the technology have been described herein for purposes of illustration, however various modifications can be made without deviating from the spirit and scope of the present invention. Accordingly, the present invention is not restricted except in the spirit of the appended claims.

Other variations to the disclosed embodiments can be understood and effected by those skilled in the art in practicing the claimed invention, from a study of the drawings, the disclosure, and the appended claims. In the claims the word "comprising" does not exclude other elements or steps, and the indefinite article "a" or "an" does not exclude a plurality. Even if particular features are recited in different dependent claims, the present invention also relates to the embodiments including all these features. Any reference signs in the claims should not be construed as limiting the scope.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

What is claimed is:

1. A transmitter for transmitting a Bluetooth packet in an enhanced data rate format, the Bluetooth packet includes a Gaussian frequency-shift keying (GFSK) modulated segment, a Guard segment and a Differential Phase-Shift Keying (DPSK) modulated segment, the transmitter comprising:
   a first multiplexer configured to select a phase signal from a Guard phase signal, a received GFSK phase signal and a received DPSK phase signal based on time;
   a second multiplexer configured to select a amplitude signal from a Guard amplitude signal, a received GFSK amplitude signal and a received DPSK amplitude signal based on time,
   a phase to frequency converter communicatively coupled to the first multiplexer and configured to convert the selected phase signal into converted frequency signal;
   a phase lock loop communicatively coupled to the phase to frequency converter and configured to generate a local oscillation signal based the converted frequency signal;
   a digital to analog converter communicatively coupled to the second multiplexer and configured to convert the selected amplitude into an analog selected amplitude; and
   a power amplifier communicatively coupled to both the phase lock loop and the digital to analog converter and configured to generate and output a radio frequency signal based on the local oscillation signal and the analog selected amplitude.

2. The transmitter of claim 1, further comprising
   a first frequency to phase converter communicatively coupled to the first multiplexer and configured to convert a frequency of the GFSK modulated segment into the GFSK phase signal.

3. The transmitter of claim 1, further comprising
   a Coordinate Rotation Digital Computer (cordic) communicatively coupled to both the first multiplexer and the second multiplexer and configured to generate the received DPSK phase signal and the received DPSK amplitude signal based on an in-phase branch and a quadrature branch of the DPSK modulated segment.

4. The transmitter of claim 1, further comprising
   a first GFSK amplitude generator communicatively coupled to the second multiplexer and configured to generate the GFSK amplitude signal based on the GFSK modulated segment.

5. The transmitter of claim 1, further comprising
   a Guard phase and amplitude generator configured to generate the Guard phase signal and the Guard amplitude signal based on the Guard segment.

6. The transmitter of claim 5, wherein the Guard phase and amplitude generator further comprises:
   a cordic circuit configured to generate a Guard DPSK phase signal and a Guard DPSK amplitude signal based on an in-phase branch and a quadrature branch of a DPSK modulated Guard signal;
   a second frequency to phase converter configured to convert a frequency of a GFSK modulated Guard signal into a phase signal of the GFSK modulated Guard signal;
   a second GFSK amplitude generator configured to generate the Guard GFSK amplitude signal;

a ramping up circuit communicatively coupled to the cordic module and configured to generate a ramped up Guard DPSK phase signal and a ramped up Guard DPSK amplitude signal based on the Guard DPSK phase signal and the Guard DPSK amplitude signal;

a ramping down circuit communicatively coupled to the second frequency to phase converter and the second GFSK amplitude generator and configured to generate a ramped down Guard GFSK phase signal and a ramped down Guard GFSK amplitude signal based on the Guard GFSK phase signal and the Guard GFSK amplitude signal;

a first adder communicatively coupled to both the ramping up unit and the ramping down unit and configured to generate and output a Guard amplitude signal by adding the ramped up Guard DPSK amplitude signal and the ramped down Guard GFSK amplitude signal; and a second adder communicatively coupled to both the ramping up unit and the ramping down unit and configured to generate and output a Guard phase signal by adding the ramped up Guard DPSK phase signal and the ramped down Guard GFSK phase signal.

7. The transmitter of claim 6, wherein the ramping up circuit and the ramping down circuit are configured to use any of the following window functions to perform the ramping down/up operation: Hamming window, Blackman window, Triangular window or Gaussian window.

8. A method of transmitting a Bluetooth packet in an enhanced data rate format, the Bluetooth packet includes a Gaussian frequency-shift keying (GFSK) modulated segment, a Guard segment and a Differential Phase-Shift Keying (DPSK) modulated segment, the method comprising:

selecting, by a first multiplexer, a phase signal from a Guard phase signal, a received GFSK phase signal and a received DPSK phase signal based on time;

selecting, by a second multiplexer, a amplitude signal from a Guard amplitude signal, a received GFSK amplitude signal and a received DPSK amplitude signal based on time, converting, by a phase to frequency converter communicatively coupled to the first multiplexer, the selected phase signal into converted frequency signal;

generating, by a phase lock loop communicatively coupled to the phase to frequency converter, a local oscillation signal based the converted frequency signal;

converting, by a digital to analog converter communicatively coupled to the second multiplexer, the selected amplitude into an analog selected amplitude; and generating and outputting, by a power amplifier communicatively coupled to both the phase lock loop and the digital to analog converter, a radio frequency signal based on the local oscillation signal and the analog selected amplitude.

9. The method of claim 8, further comprising converting, by a first frequency to phase converter communicatively coupled to the first multiplexer, a frequency of the GFSK modulated segment into the GFSK phase signal.

10. The method of claim 8, further comprising generating, by a Coordinate Rotation Digital Computer (cordic) communicatively coupled to both the first multiplexer and the second multiplexer, the received DPSK phase signal and the received DPSK amplitude signal based on an in-phase branch and a quadrature branch of the DPSK modulated segment.

11. The method of claim 8, further comprising generating, by a first GFSK amplitude generator communicatively coupled to the second multiplexer, the GFSK amplitude signal based on the GFSK modulated segment.

12. The method of claim 8, further comprising generating, by a Guard phase and amplitude generator, the Guard phase signal and the Guard amplitude signal based on the Guard segment.

13. The method of claim 12, wherein generating, by a Guard phase and amplitude generator, the Guard phase signal and the Guard amplitude signal based on the Guard segment is further implemented by:

generating, by a cordic module, a Guard DPSK phase signal and a Guard DPSK amplitude signal based on an in-phase branch and a quadrature branch of a DPSK modulated Guard signal;

converting, by a second frequency to phase converter, a frequency of a GFSK modulated Guard signal into a phase signal of the GFSK modulated Guard signal;

generating, by a second GFSK amplitude generator, the Guard GFSK amplitude signal;

generating, by a ramping up unit communicatively coupled to the cordic module, a ramped up Guard DPSK phase signal and a ramped up Guard DPSK amplitude signal based on the Guard DPSK phase signal and the Guard DPSK amplitude signal;

generating, by a ramping down unit communicatively coupled to the second frequency to phase converter and the second GFSK amplitude generator, a ramped down Guard GFSK phase signal and a ramped down Guard GFSK amplitude signal based on the Guard GFSK phase signal and the Guard GFSK amplitude signal;

generating and outputting, by a first adder communicatively coupled to both the ramping up unit and the ramping down unit, a Guard amplitude signal by adding the ramped up Guard DPSK amplitude signal and the ramped down Guard GFSK amplitude signal; and generating and outputting, by a second adder communicatively coupled to both the ramping up unit and the ramping down unit, a Guard phase signal by adding the ramped up Guard DPSK phase signal and the ramped down Guard GFSK phase signal.

14. The method of claim 13, further comprising using any of the following window functions to perform the ramping down/up operation: Hamming window, Blackman window, Triangular window or Gaussian window.

* * * * *